United States Patent
Kumar et al.

(10) Patent No.: US 11,409,837 B2
(45) Date of Patent: Aug. 9, 2022

(54) SYSTEMS AND METHODS FOR DENSE SURFACE RECONSTRUCTION OF AN OBJECT USING GRAPH SIGNAL PROCESSING

(71) Applicant: Tata Consultancy Services Limited, Mumbai (IN)

(72) Inventors: Achanna Anil Kumar, Bangalore (IN); Balamuralidhar Purushothaman, Bangalore (IN); Girish Mariswamy Chandra, Bangalore (IN)

(73) Assignee: Tata Consultancy Services Limited, Mumbai (IN)

( * ) Notice: Subject to any disclaimer, the term of this patent is extended or adjusted under 35 U.S.C. 154(b) by 583 days.

(21) Appl. No.: 16/559,095

(22) Filed: Sep. 3, 2019

(65) Prior Publication Data
US 2020/0073909 A1 Mar. 5, 2020

(30) Foreign Application Priority Data
Sep. 1, 2018 (IN) .............................. 201821032911

(51) Int. Cl.
*G06F 17/14* (2006.01)
*G06T 7/50* (2017.01)
(Continued)

(52) U.S. Cl.
CPC .............. *G06F 17/14* (2013.01); *G01B 11/24* (2013.01); *G06T 7/50* (2017.01); *H01L 27/146* (2013.01)

(58) Field of Classification Search
CPC ........... G06F 17/14; G06T 7/50; G01B 11/24; H01L 27/146
(Continued)

(56) References Cited

U.S. PATENT DOCUMENTS

2011/0134220 A1* 6/2011 Barbour .................. G06T 15/00
348/44
2012/0287247 A1* 11/2012 Stenger ................ H04N 13/254
348/47
(Continued)

FOREIGN PATENT DOCUMENTS

WO WO-2018/061508 4/2018

OTHER PUBLICATIONS

Kadambi, A. et al. (2015). "Polarized 3D: High-Quality Depth Sensing with Polarization Cues," 2015 *IEEE International Conference on Computer Vision (ICCV)*, Dec. 7-13 (9 pages).
(Continued)

*Primary Examiner* — Jin Ge
(74) *Attorney, Agent, or Firm* — Finnegan, Henderson, Farabow, Garrett & Dunner, LLP

(57) ABSTRACT

Systems and methods for a dense surface reconstruction of an object using graph signal processing is provided. None of the traditional systems and methods provide for a dense or three-dimensional surface reconstruction of objects by resolving π ambiguity. The embodiments of the proposed disclosure provide for resolving π ambiguity by identifying, from one or more sparse three-dimensional shapes extracted, a first set of azimuth values corresponding to a first region of the object; constructing, using a phase angle, a graph capturing a relational structure between the first set of azimuth values and a second set of azimuth values to be estimated; obtaining, a Graph Fourier Transform (GFT) matrix corresponding to the constructed graph; and estimating, from the GFT matrix and the first set of azimuth values, the second set of azimuth values corresponding to a second region of the object by the graph signal processing technique.

18 Claims, 9 Drawing Sheets

(51) Int. Cl.
*G01B 11/24* (2006.01)
*H01L 27/146* (2006.01)

(58) Field of Classification Search
USPC .......................................................... 345/581
See application file for complete search history.

(56) References Cited

U.S. PATENT DOCUMENTS

| | | | |
|---|---|---|---|
| 2015/0219437 A1* | 8/2015 | Dowski | G01S 5/16 |
| | | | 701/1 |
| 2016/0261844 A1 | 9/2016 | Kadambi et al. | |
| 2018/0107108 A1* | 4/2018 | Nakatani | G01B 11/168 |
| 2019/0130630 A1* | 5/2019 | Ackerson | G06T 9/001 |
| 2020/0242335 A1* | 7/2020 | Eshima | G06T 7/70 |
| 2021/0243374 A1* | 8/2021 | Ishida | H04N 5/23222 |

OTHER PUBLICATIONS

Cui, Z. et al. (2017). "Polarmetric Multi-View Stereo," 2017 *IEEE Conference on Computer Vision and Pattern Recognition (CVPR)*, Nov. 9 (11 pages).

D'Angelo, P. et al. (2006). "Image-Based 3D Surface Reconstruction by Combination of Sparse Depth Data with Shape from Shading and Polarisation," 2006 *Symposium of ISPRS Commissioner III Photogrammetric Computer Vision PCV*, Sep. 20-22. (6 pages).

* cited by examiner

| Capturing, using an image capturing device, a plurality of multi-view polarized images, wherein each of the plurality of multi-view polarized images comprises a multi-pixel image of an object varying with a plurality of angles of polarization — 201 |

| Performing, by one or more hardware processors, a plurality of steps based upon the plurality of polarized images captured, wherein the plurality of steps comprise: (i) extracting, by implementing a Multi-View Stereo (MVS) technique on each of the plurality of multi-view polarized images captured, one or more sparse three-dimensional shapes of the object, wherein the one or more sparse three-dimensional shapes are used to identify a first set of azimuth values corresponding to a first region of the object; and (ii) computing, by implementing a polarization reflectance modelling technique on the plurality of multi-view polarized images captured, a degree of polarization and a phase angle corresponding to each view of a surface point of the object — 202 |

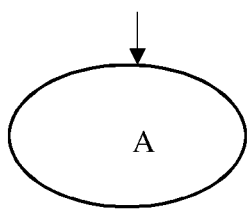

FIG. 2A

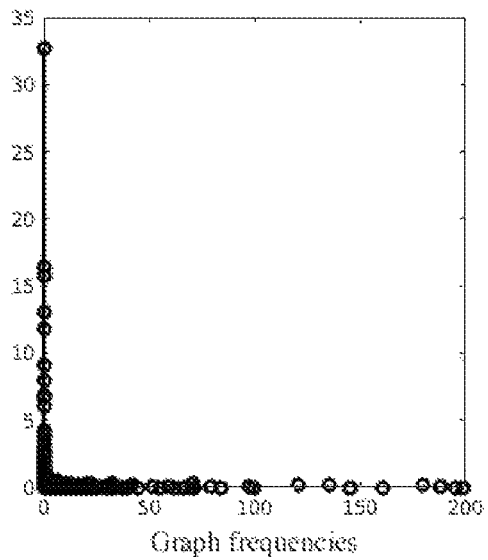
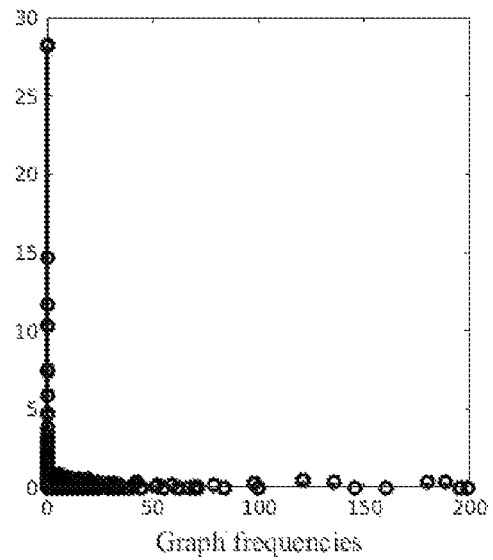
FIG. 6A
FIG. 6B
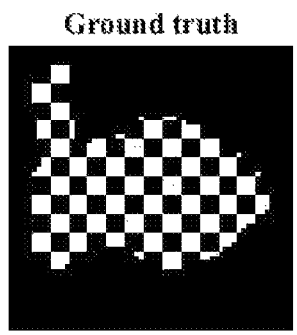
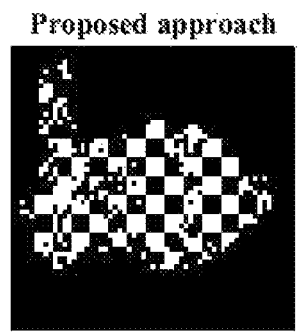
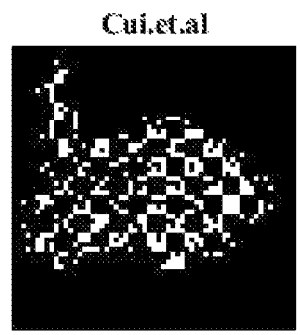
FIG. 7A
FIG. 7B
FIG. 7C

SYSTEMS AND METHODS FOR DENSE SURFACE RECONSTRUCTION OF AN OBJECT USING GRAPH SIGNAL PROCESSING

PRIORITY CLAIM

This U.S. patent application claims priority under 35 U.S.C. § 119 to Indian Application No. 201821032911, filed on Sep. 1, 2018. The entire contents of the aforementioned application are incorporated herein by reference.

TECHNICAL FIELD

This disclosure relates generally to surface reconstruction, and more particularly to systems and methods for a dense surface reconstruction of an object using graph signal processing.

BACKGROUND

Digital reconstruction or reproduction of shapes and appearances of real-world objects has been gaining a lot of momentum in this digital era, especially due to its applicability in a wide variety of areas. In particular, a three-dimensional (3D) reconstruction of objects has received increasing attention in recent years. Some of the traditional techniques use a combination of 3D scanning and photography under different lighting conditions to acquire models of an object's shape and reflectance. When both of these characteristics are measured, the models may be used to faithfully render how the object would look from any viewpoint, reflecting the light of any environment.

The inventors here have recognized several technical problems with such conventional systems, as explained below. One of the widely used digital reconstruction technique is Multi-view stereo (MVS) technique. The MVS reconstructs dense 3D models from multiple images. The MVS has been intensively studied in computer vision with wide applications in computer graphics, robotics, computer-aided design, and human computer interactions. The MVS relies on finding feature correspondences with epipolar constraints, and thus it is fundamentally flawed in dealing with featureless objects, since correspondence cannot be reliably found. However, on a feature sparse 3D objects, typical multi-view 3D reconstruction methods such as the MVS fail to provide dense reconstruction, since the MVS is essentially based on feature correspondence.

SUMMARY

Embodiments of the present disclosure present technological improvements as solutions to one or more of the above-mentioned technical problems recognized by the inventors in conventional systems. For example, in one embodiment, a method for a dense surface reconstruction of an object using graph signal processing is provided, the method comprising: capturing, using an image capturing device, a plurality of multi-view polarized images, wherein each of the plurality of multi-view polarized images comprises a multi-pixel image of the object varying with a plurality of angles of polarization; performing, by one or more hardware processors, a plurality of steps based upon the plurality of polarized images captured, wherein the plurality of steps comprise: (i) extracting, by implementing a Multi-View Stereo (MVS) technique on each of the plurality of multi-view polarized images captured, one or more sparse three-dimensional shapes of the object, wherein the one or more sparse three-dimensional shapes are used to identify a first set of azimuth values corresponding to a first region of the object; and (ii) computing, by implementing a polarization reflectance modelling technique on the plurality of multi-view polarized images captured, a degree of polarization and a phase angle corresponding to each view of a surface point of the object; estimating, using the phase angle and the one or more sparse three-dimensional shapes, a second set of azimuth values by a graph signal processing technique, wherein the estimation comprises: (i) identifying, from the one or more sparse three-dimensional shapes, the first set of azimuth values corresponding to the first region of the object; (ii) constructing, using the phase angle, a graph capturing a relational structure between the first set of azimuth values and the second set of azimuth values to be estimated; (iii) obtaining, a Graph Fourier Transform (GFT) matrix corresponding to the constructed graph by the graph signal processing technique; and (iv) estimating, from the GFT matrix and the first set of azimuth values, the second set of azimuth values comprising unambiguous azimuth values corresponding to a second region of the object by the graph signal processing technique; classifying, based upon a comparison of the estimated second set of azimuth values and the phase angle, a polarized specular reflection dominant region and a polarized diffuse reflection dominant region of the object; estimating, based upon the classification, a zenith angle by implementing a non-linear least squares estimation technique, wherein the zenith angle is a function of the degree of polarization and refractive index of surface of the object; reconstructing, using the second set of azimuth values and the zenith angle, a dense three-dimensional surface of the object; obtaining a sampling set corresponding to the first set of azimuth values by implementing the graph signal processing technique; performing a linear transformation on the GFT matrix using a graph signal reconstruction technique; representing, by the graph signal processing technique, a Graph Fourier Transform (GFT) spectrum of the phase angle for estimating the second set of azimuth values; selecting, based upon the GFT spectrum, and selecting a cut-off graph frequency to estimate the second set of azimuth values, and wherein the cut-off graph frequency corresponds to the constructed graph.

In another aspect, there is provided a system for a dense surface reconstruction of an object using graph signal processing, the system comprising a memory storing instructions; one or more communication interfaces; and one or more hardware processors coupled to the memory via the one or more communication interfaces, wherein the one or more hardware processors are configured by the instructions to: capture, using an image capturing device, a plurality of multi-view polarized images, wherein each of the plurality of multi-view polarized images comprises a multi-pixel image of the object varying with a plurality of angles of polarization; perform a plurality of steps based upon the plurality of polarized images captured, wherein the plurality of steps comprise: (i) extracting, by implementing a Multi-View Stereo (MVS) technique on each of the plurality of multi-view polarized images captured, one or more sparse three-dimensional shapes of the object, wherein the one or more sparse three-dimensional shapes are used to identify a first set of azimuth values corresponding to a first region of the object; and (ii) computing, by implementing a polarization reflectance modelling technique on the plurality of multi-view polarized images captured, a degree of polarization and a phase angle corresponding to each view of a surface point of the object; estimate, using the phase angle and the one or more sparse three-dimensional shapes, a second set of azimuth values by a graph signal processing technique, wherein the estimation comprises: (i) identifying, from the one or more sparse three-dimensional shapes, the first set of azimuth values corresponding to the first region of the object; (ii) constructing, using the phase angle, a graph capturing a relational structure between the first set of azimuth values and the second set of azimuth values to be estimated; (iii) obtaining, a Graph Fourier Transform (GFT) matrix corresponding to the constructed graph by the graph signal processing technique; and (iv) estimating, from the GFT matrix and the first set of azimuth values, the second set of azimuth values comprising unambiguous azimuth values corresponding to a second region of the object by the graph signal processing technique; classify, based upon a comparison of estimated the second set of azimuth values and the phase angle, a polarized specular reflection dominant region and a polarized diffuse reflection dominant region of the object; estimate, based upon the classification, a zenith angle by implementing a non-linear least squares estimation technique, wherein the zenith angle is a function of the degree of polarization and refractive index of surface of the object; reconstruct, using the second set of azimuth values and the zenith angle, a dense three-dimensional surface of the object; estimate the second set of azimuth values by obtaining a sampling set corresponding to the first set of azimuth values by implementing the graph signal processing technique; perform a linear transformation on the GFT matrix using a graph signal reconstruction technique to estimate the second set of azimuth values; construct the graph by representing, using the graph signal processing technique, a Graph Fourier Transform (GFT) spectrum of the phase angle for estimating the second set of azimuth values; and represent the GFT spectrum by selecting, based upon the GFT spectrum, a cut-off graph frequency to estimate the second set of azimuth values, and wherein the cut-off graph frequency corresponds to the constructed graph.

In yet another aspect, there is provided one or more non-transitory machine readable information storage mediums comprising one or more instructions which when executed by one or more hardware processors causes the one or more hardware processors to perform a method for a dense surface reconstruction of an object using graph signal processing, the method comprising: capturing, using an image capturing device, a plurality of multi-view polarized images, wherein each of the plurality of multi-view polarized images comprises a multi-pixel image of the object varying with a plurality of angles of polarization; performing a plurality of steps based upon the plurality of polarized images captured, wherein the plurality of steps comprise: (i) extracting, by implementing a Multi-View Stereo (MVS) technique on each of the plurality of multi-view polarized images captured, one or more sparse three-dimensional shapes of the object, wherein the one or more sparse three-dimensional shapes are used to identify a first set of azimuth values corresponding to a first region of the object; and (ii) computing, by implementing a polarization reflectance modelling technique on the plurality of multi-view polarized images captured, a degree of polarization and a phase angle corresponding to each view of a surface point of the object; estimating, using the phase angle and the one or more sparse three-dimensional shapes, a second set of azimuth values by a graph signal processing technique, wherein the estimation comprises: (i) identifying, from the one or more sparse three-dimensional shapes, the first set of azimuth values corresponding to the first region of the object; (ii) constructing, using the phase angle, a graph capturing a relational structure between the first set of azimuth values and the second set of azimuth values to be estimated; (iii) obtaining, a Graph Fourier Transform (GFT) matrix corresponding to the constructed graph by the graph signal processing technique; and (iv) estimating, from the GFT matrix and the first set of azimuth values, the second set of azimuth values comprising unambiguous azimuth values corresponding to a second region of the object by the graph signal processing technique; classifying, based upon a comparison of the estimated second set of azimuth values and the phase angle, a polarized specular reflection dominant region and a polarized diffuse reflection dominant region of the object; estimating, based upon the classification, a zenith angle by implementing a non-linear least squares estimation technique, wherein the zenith angle is a function of the degree of polarization and refractive index of surface of the object; reconstructing, using the second set of azimuth values and the zenith angle, a dense three-dimensional surface of the object; obtaining a sampling set corresponding to the first set of azimuth values by implementing the graph signal processing technique; performing a linear transformation on the GFT matrix using a graph signal reconstruction technique; representing, by the graph signal processing technique, a Graph Fourier Transform (GFT) spectrum of the phase angle for estimating the second set of azimuth values; selecting, based upon the GFT spectrum, and selecting a cut-off graph frequency to estimate the second set of azimuth values, and wherein the cut-off graph frequency corresponds to the constructed graph.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this disclosure, illustrate exemplary embodiments and, together with the description, serve to explain the disclosed principles.

FIGS. 2A, 2B and 2C are a flow diagram illustrating the steps involved in the process of the dense surface reconstruction of the object using the graph signal processing, in accordance with some embodiments of the present disclosure.

FIG. 6A illustrates magnitude plots of a Graph Fourier Spectrum of an actual azimuth with respect to graph frequencies, in accordance with some embodiments of the present disclosure.

FIG. 6B illustrates magnitude plots of a computed phase angle with respect to graph frequencies, in accordance with some embodiments of the present disclosure.

FIGS. 7A, 7B and 7C illustrate a graphical classification of the results obtained by implementing the proposed methodology and traditional systems and methods, in accordance with some embodiments of the present disclosure.

DETAILED DESCRIPTION

Figure 1:
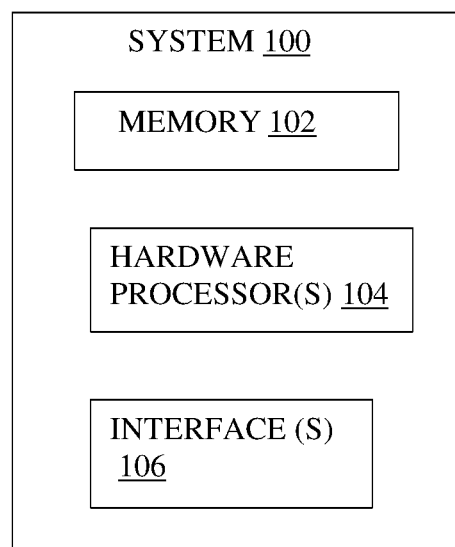
FIG. 1 illustrates a block diagram of a system for a dense surface reconstruction of an object using graph signal processing, in accordance with some embodiments of the present disclosure.

Exemplary embodiments are described with reference to the accompanying drawings. In the figures, the left-most digit(s) of a reference number identifies the figure in which the reference number first appears. Wherever convenient, the same reference numbers are used throughout the drawings to refer to the same or like parts. While examples and features of disclosed principles are described herein, modifications, adaptations, and other implementations are possible without departing from the scope of the disclosed embodiments. It is intended that the following detailed description be considered as exemplary only, with the true scope being indicated by the following claims.

Embodiments of the present disclosure provide systems and methods for a dense surface reconstruction of an object using graph signal processing. Multi-view Stereo (MVS) three-dimensional (3D) surface reconstruction is an important problem in computer vision whose application includes 3D scanning and printing, augmented reality including products inspection and many more. In many of these applications, it is most desirable to obtain dense reconstruction. However, in practical, due to various limitations of the MVS (for example, it is based upon feature correspondence), it fails to provide the dense surface reconstruction of the objects.

An alternate approach known as Polarimetric multi-view stereo (PMS) reconstructs the dense 3D surface of a feature sparse object by combining the photometric information from polarization with the epipolar constraints from multiple views (see, e.g., Z. Cui, J. Gu, B. Shi, P. Tan, and J. Kautz, "Polarimetric multi-view stereo," in 2017 *Proceedings of the IEEE Conference on Computer Vision and Pattern Recognition* pp. 1558-1567). The PMS does not make use of an impractical assumption of polarized diffuse only or polarized specular only reflection and also overcomes the necessity of lighting direction or the additional sensor such as a Red Green Blue and Depth (RGB-D) sensor.

When an unpolarized light is incident on surface(s), most surfaces reflect a partially polarized light. This polarized light contains rich information about surface normal of tan object and forms the basis for shape from polarization (SfP) cue. The surface normal, thus obtained from employing the PMS is dense, and unlike the other above mentioned techniques, it does not require controlled illuminations or dense features, and hence can densely reconstruct smooth featureless 3D objects.

However, the surface normal obtained from the polarization has certain ambiguities, which must be resolved before it can meaningfully be used for shape reconstruction. One of the main ambiguity in using the SfP approach is in the estimation of azimuth from phase angle. Two types of ambiguities referred as $\pi/2$ ambiguity and $\pi$ ambiguity must be resolved for azimuth estimation.

While some of the traditional systems and methods provide for resolving $\pi/2$ ambiguity, none of the traditional systems and methods provide for resolving $\pi$ ambiguity. The traditional systems and methods, for example, the PMS, simply bypass $\pi$ ambiguity while providing for the dense reconstruction, and hence do not resolve $\pi$ ambiguity.

Referring now to the drawings, and more particularly to FIG. 1 through 7C, where similar reference characters denote corresponding features consistently throughout the figures, there are shown preferred embodiments and these embodiments are described in the context of the following exemplary system and/or method.

FIG. 1 illustrates an exemplary block diagram of a system 100 for a dense surface reconstruction of an object using graph signal processing, in accordance with an embodiment of the present disclosure. In an embodiment, the system 100 includes one or more processors 104, communication interface device(s) or input/output (I/O) interface(s) 106, and one or more data storage devices or memory 102 operatively coupled to the one or more processors 104. The one or more processors 104 that are hardware processors can be implemented as one or more microprocessors, microcomputers, microcontrollers, digital signal processors, central processing units, state machines, logic circuitries, and/or any devices that manipulate signals based on operational instructions. Among other capabilities, the processor(s) is configured to fetch and execute computer-readable instructions stored in the memory 102. In an embodiment, the system 100 can be implemented in a variety of computing systems, such as laptop computers, notebooks, hand-held devices, workstations, mainframe computers, servers, a network cloud and the like.

The I/O interface device(s) 106 can include a variety of software and hardware interfaces, for example, a web interface, a graphical user interface, and the like and can facilitate multiple communications within a wide variety of networks N/W and protocol types, including wired networks, for example, LAN, cable, etc., and wireless networks, such as WLAN, cellular, or satellite. In an embodiment, the I/O interface device(s) can include one or more ports for connecting a number of devices to one another or to another server.

The memory 102 may include any computer-readable medium known in the art including, for example, volatile memory, such as static random access memory (SRAM) and dynamic random access memory (DRAM), and/or non-volatile memory, such as read only memory (ROM), erasable programmable ROM, flash memories, hard disks, optical disks, and magnetic tapes.

Figure 2B:
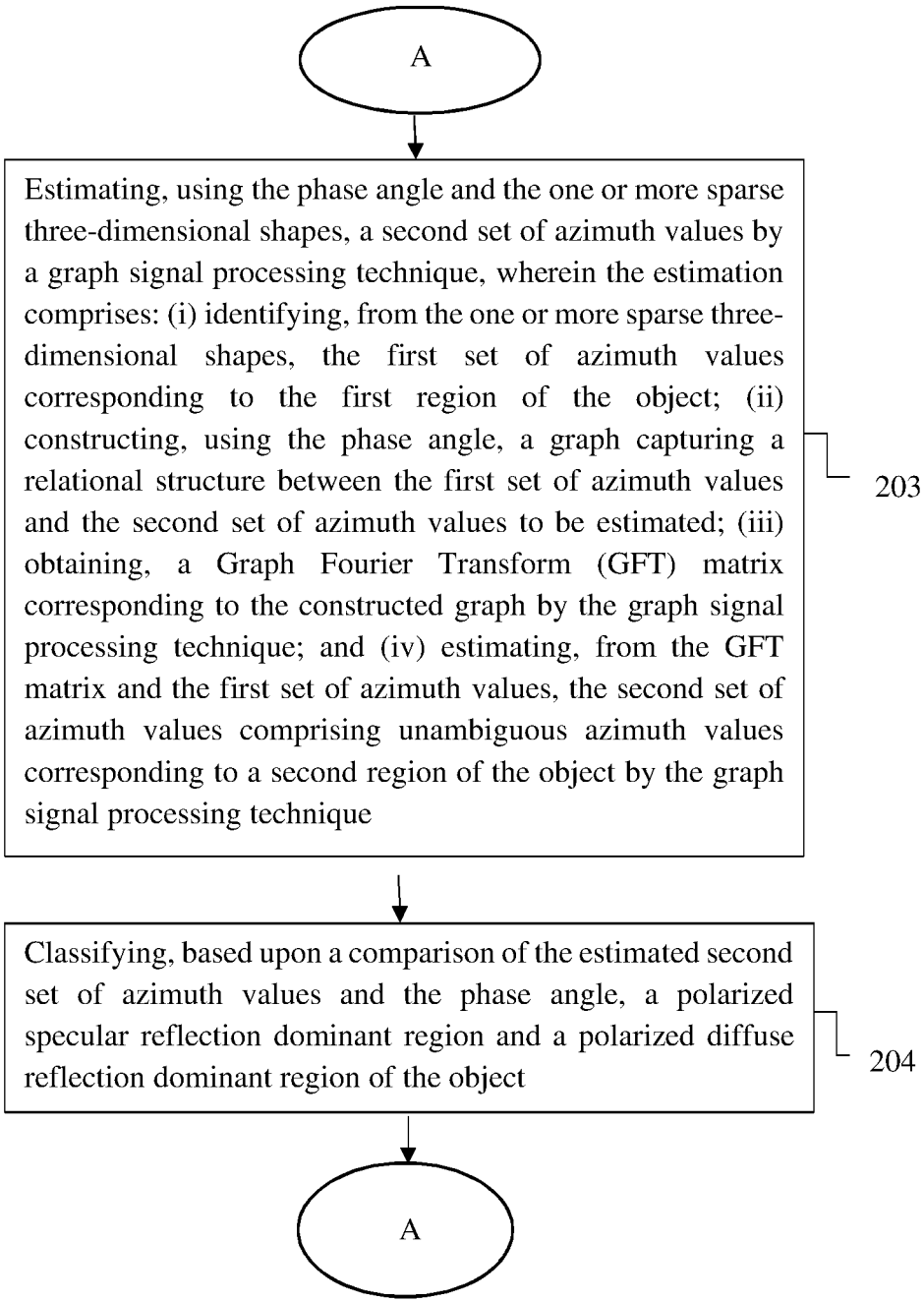
Figure 2C:
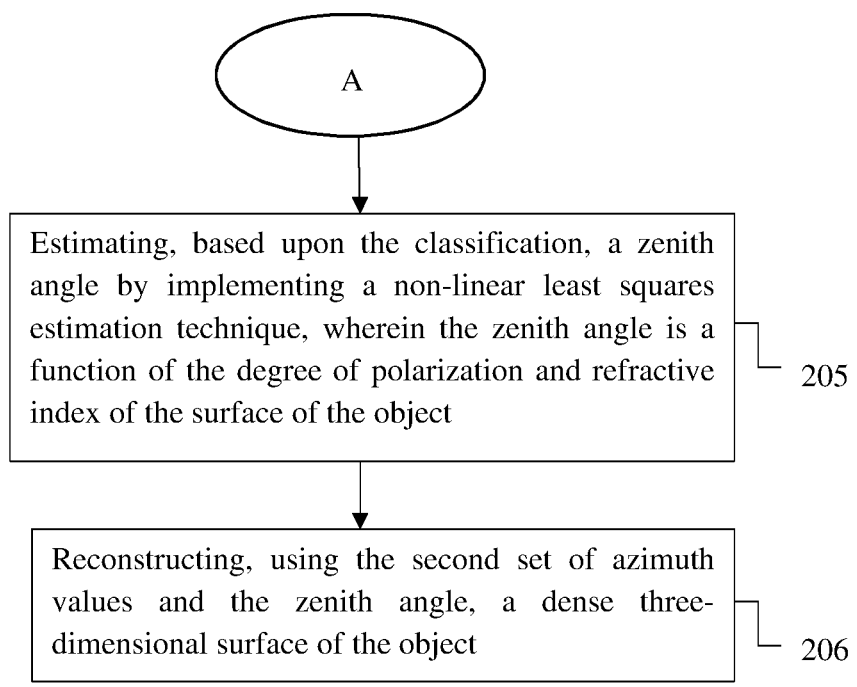

FIG. 2A through 2C, with reference to FIG. 1, illustrates an exemplary flow diagram of a method for the dense surface reconstruction of the object using the graph signal processing, in accordance with some embodiments of the present disclosure. In an embodiment the system 100 comprises one or more data storage devices of the memory 102 operatively coupled to the one or more hardware processors 104 and is configured to store instructions for execution of steps of the method by the one or more processors 104. The steps of the method of the present disclosure will now be explained with reference to the components of the system 100 as depicted in FIG. 1 and the flow diagram. In the embodiments of the present disclosure, the hardware processors 104 when configured the instructions performs one or more methodologies described herein.

According to an embodiment of the present disclosure, at step 201, a plurality of multi-view polarized images may be captured via an image capturing device (not shown in the figure), wherein each of the plurality of multi-view polarized images comprises a multi-pixel image of the object varying with a plurality of angles of polarization. The image capturing device may comprise (but not limited to) of a Digital Single-Lens Reflex camera (DSLR) camera with a polarizing lens. The polarizing lens of the DSLR camera is rotated at different angles of polarization to capture at least one multi-pixel image of the object (of interest) from each angle to obtain the plurality of multi-view polarized images.

Figure 3A:
FIGS. 3A, 3B and 3C illustrate an example of a plurality of multi-view polarized images captured, in accordance with some embodiments of the present disclosure.
Figure 3B:
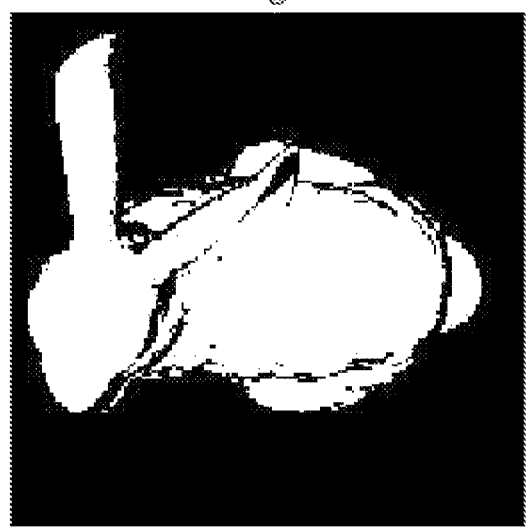
Figure 3C:
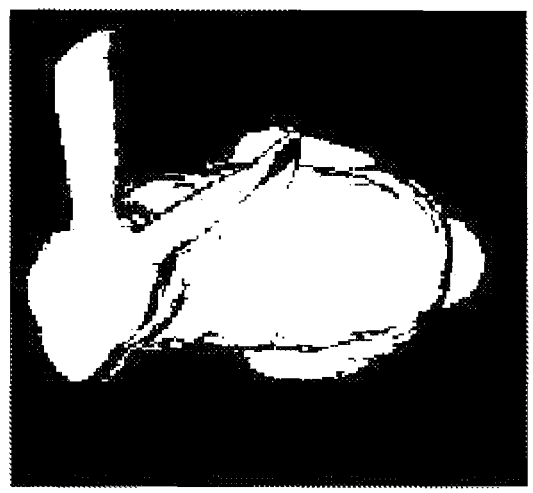
Figure 4:
FIG. 4 illustrates an example of one or more sparse three-dimensional shapes extracted by implementing a Multi-view Stereo (MVS) technique, in accordance with some embodiments of the present disclosure.
Figure 5:
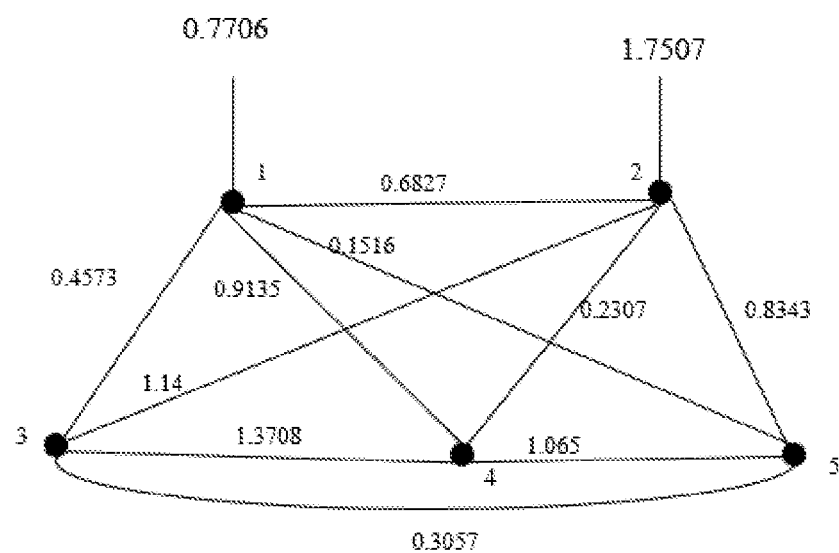
FIG. 5 illustrates an example of a constructed graph, in accordance with some embodiments of the present disclosure.

As is known in the art, when an unpolarized light ray falls on any object, three types of reflections may be observed, namely, a polarized specular reflection, a polarized diffuse reflection, and an unpolarized diffuse reflection, wherein both the polarized specular reflection and the polarized diffuse reflection are partially polarized on most surfaces. The reflected light may then be passed through the polarizing lens, and as mentioned above, the polarized lens may then be rotated at different angles of polarization (that is, at least three different angles of polarization) obtain the plurality of multi-view polarized images. Referring to FIG. 3A through 3C, an example of the plurality of multi-view polarized images captured at 0°, 60°, and 120° may be referred.

According to an embodiment of the present disclosure, at step 202, the one or more hardware processors 104 perform a plurality of steps based upon the plurality of polarized images captured. At step 202(i), the one or more hardware processors 104 extract, by implementing a Multi-View Stereo (MVS) technique on each of the plurality of multi-view polarized images captured, one or more sparse three-dimensional shapes of the object. In an embodiment, the one or more sparse three-dimensional shapes are used to identify a first set of azimuth values corresponding to a first region of the object (explained in step 203(i) below).

As is known in the art, the MVS technique (or a Multi-View three-dimensional (3D) surface reconstruction technique) comprises reconstructing a complete three-dimensional (3D) model from a set of images taken from different viewpoints. The MVS technique comprises two major steps: (i) estimating the 3D points on the basis of a photo-consistency measure and visibility model using a local image matching method and (ii) reconstructing the 3D model from estimated 3D point clouds.

In an embodiment, the MVS technique that may be implemented to extract the one or more sparse three-dimensional shapes of the object may comprise of a Level-set technique or a space-carving technique. Sparse representations (or the one or more sparse three-dimensional shapes) of each of the plurality of polarized images extracted by implementing the MVS technique comprise restored data, and thereby provide for an enhanced multi-view polarized images. In an example implementation, referring to FIG. 4, an example of a sparse three-dimensional shape extracted by implementing the MVS technique on each of the plurality of multi-view polarized images captured (and referred to in FIG. 3A through 3C) may be referred.

At step 202(ii), the one or more hardware processors 104 compute, by implementing a polarization reflectance modelling technique (for example, a Lambertian modelling) on the plurality of multi-view polarized images captured, a degree of polarization and a phase angle corresponding to each view of a surface point of the object. As is known in the art, the polarization reflectance modelling technique are used, inter-alia, for accurately predicting magnitudes of polarization components of reflected light, intensity edges caused by one or more specularities, constraining surface normal, and the like.

As mentioned above, when an unpolarized light ray falls on the object, three types of reflections may be observed, namely, the polarized specular reflection, a polarized diffuse reflection, and the unpolarized diffuse reflection, wherein both the polarized specular reflection and the polarized diffuse reflection are partially polarized on most surfaces. The intensity of such reflected polarized components varies sinusoidally as a function of a polarizing angle of a polarizing function, for example, $\varnothing_{pol}$. In particular, the measured intensity corresponding to the polarized diffuse reflection $I^{dp}(\varnothing_{pol})$ and the polarized specular reflection $I^{sp}(\varnothing_{pol})$ may be expressed as equation (1) below:

$$I^{xp}(\varnothing_{pol}) = \frac{I_{max} + I_{min}}{2} + \frac{I_{max} - I_{min}}{2}\cos(2(\varnothing_{pol} - \varnothing)), \quad \text{equation (1)}$$

wherein $x \in \{s, d\}$, and $I_{max}$ and $I_{min}$ denote the maximum and minimum values of the observed sinusoidally varying intensities, respectively. The phase angle $\varnothing$ (phi) and the azimuth angle $\varphi$ at any point on the surface of the object depends upon the dominant reflection type and are related as shown in equation (2) below:

$$\varnothing = \begin{cases} \varphi, & \text{if polarized diffuse reflection dominates} \\ \varphi - \frac{\pi}{2}, & \text{otherwise} \end{cases} \quad \text{equation (2).}$$

The factor $$I_{un} = \frac{I_{max} + I_{min}}{2}$$

denotes the unpolarized intensity and the factor $$\rho = \frac{I_{max} - I_{min}}{I_{max} + I_{min}}$$

is referred to as the degree of polarization. Depending upon the type of reflection, that is, the polarized diffuse reflection or the polarized specular reflection, the degree of polarization $\rho$ may also be related as in equations (3) and (4) below:

$$\rho = \frac{2\sin\theta\tan\theta\sqrt{n^2 - \sin^2\theta}}{n^2 - 2\sin^2\theta + \tan^2\theta}; \text{ and} \quad \text{equation (3)}$$

$$\rho = \frac{(n - 1/n)^2\sin^2\theta}{2 + 2n^2(n + 1/n)^2\sin^2\theta + 4\cos\theta\sqrt{n^2 - \sin^2\theta}}, \quad \text{equation (4)}$$

wherein n and $\theta$ denote refractive index and zenith angle respectively. In an embodiment, equation (3) provides a relationship for the polarized specular reflection, while equation (4) provides a relationship for the polarized diffuse reflection. Generally, the phase angle $\varnothing$ (phi) denotes a fraction of an oscillation which has elapsed with respect to the origin or zero crossing. The degree of polarization comprises polarization degree of an incident light corresponding to the object. In an embodiment, the phase angle $\varnothing$ (phi) computed facilitates estimating azimuth values at feature-limited region.

Considering same example scenario as in step 201 above, using the polarized reflection modelling technique, for example, a non-linear least squares algorithm, the phase angle $\varnothing$ and the degree of polarization $\rho$ may be computed for the plurality of multi-view polarized images captured at 0°, 60°, and 120° as:

Ø=0.9777, 0.0896, 0.5204, 0.3205, and 0.8261, wherein the computed phase angle values correspond to a set of five neighboring points on the surface of the object, and wherein each computed phase value corresponds to one point amongst the set of five neighboring points.

According to an embodiment of the present disclosure, at step 203, the one or more hardware processors 104 estimate a second set of azimuth values using the computed phase angle and the one or more sparse three-dimensional shapes, wherein the second set of azimuth values are estimated by implementing a graph signal processing technique. The second set of azimuth values (comprising unambiguous azimuth values) estimated resolve both π and $$\frac{\pi}{2}$$

ambiguity. Thus, as compared to the traditional systems and methods, which simply provide for resolving $$\frac{\pi}{2}$$

ambiguity, the proposed disclosure provides a methodology for resolving both π and $$\frac{\pi}{2}$$

ambiguity, by implementing the graph signal processing technique. The process of estimating the second set of azimuth values to resolve the π ambiguity may now be considered in detail.

Graph Signal Processing—

The implementation of the graph signal processing (also referred to as the graph signal processing technique) for estimating the second set of azimuth values may be discussed by understanding graph signals, Graph Fourier Transform (GFT), Band-limitedness, sampling and reconstruction of sampled signals.

In an embodiment, graph signals are signals whose samples are indexed by the nodes of the graph G. G=(V, ε) denote a known, connected, undirected and a weighted graph comprising of N nodes indexed by a set V={1, 2, ..., N} and connected by edges ε={(p, q, $w_{pq}$)}, p, q ∈ V, wherein $w_{pq}$ denotes weight of the edge between $p^{th}$ and $q^{th}$ node and $w_{pp}$=0. The N×N adjacency matrix W with $[W]_{p,q}=w_{pq}$ is a symmetric matrix, that is, W∈ $\mathbb{S}^N$ due to an assumption of the undirected graph. A graph Laplacian comprises a key matrix and may be defined as L=D−W, wherein the diagonal matrix D=diag{$d_1, d_2, ..., d_N$} may be referred to as a degree matrix, and for all 1≤p≤N, $d_p=\Sigma_{q=1}^{N}[W]_{p,q}$.

A graph shift operator S in the graph signal processing technique performs similar functions, as is performed by the shift operator, that is, shift $z^{-1}$ in traditional discrete signal processing techniques. Generally, selections for S comprise either of the Laplacian matrix or the adjacency matrix. Since S is a symmetric matrix, it admits the factorization S=[$u_1, ..., u_N$]diag($\lambda_1, ..., \lambda_N$)[$u_1, ..., u_N$]$^H$. The eigenvectors U={$u_1, ..., u_N$} and the corresponding eigenvalues {$\lambda_1, ..., \lambda_N$} provide a notion of frequency in the context of the graphs, and hence the matrices $U^H$ and U may be referred to as a forward Graph Fourier Transform (GFT) matrix and an inverse GFT matrix respectively (Reference: D. I. Shuman, S. K. Narang, P. Frossard, A. Ortega, and P. Vandergheynst, "The emerging field of signal processing on graphs: Extending high-dimensional data analysis to networks and other irregular domains," IEEE Signal Processing Magazine, vol. 30, no. 3, pp. 83-98, 2013). Thus, the GFT and inverse GFT of the graph signal f may be defined as $\check{f}=U^H f$ and $f=U\check{f}$ respectively.

Further, the graph signal f may be defined as ω-bandlimited if $\check{f}_p=0$ for all p with $|\lambda_p|>\omega$. In an embodiment, let R={1, 2, ..., r} and the complementary set be $R^c=V\setminus R$, where r denotes the number of eigenvalues that are less than ω, and where $U_{VR}$ denotes the sub-matrix of U containing the columns corresponding to R. The ω-bandlimed signal may thus be expressed via equation (5) below:

$$f=U^H\check{f}=U_{VR}\check{f} \qquad \text{equation (5)}.$$

The set {($u_1, u_2 ..., U_r$} spans a vector space which may be referred as a Paley-Wiener space denoted by $PW_\omega(G)$, and comprising of all the ω-band-limited graph signals.

In an embodiment, the bandlimitedness allows the signal f to be sampled and reconstructed without any loss of information. Let S denotes a sampling set, that is, S comprises the indices of the sampling nodes, with |S|=d. Let $S_d$ be a matrix of size N×d whose columns are indicator functions of S, and the sampling set operator $S_d^T$: $\mathbb{R}^N\rightarrow \mathbb{R}^d$ (Reference: A. Anis, A. Gadde, and A. Ortega, "Efficient sampling set selection for bandlimited graph signals using graph spectral proxies," IEEE Transactions on Signal Processing, vol. 64, no. 14, pp. 3775-3789, 2016). The sampled vector $f_S=S_d^T f$. Correspondingly, the reconstruction from the sampled signal $f_S$ may be performed using equation (6) below:

$$\hat{f}=(U_{VR}(U_{SR}^H U_{SR})^{-1}U_{SR}^H)f_S \qquad \text{equation (6)},$$

wherein the sub-matrix $U_{SR}=S_d^T U_{VR}$. Referring to the dimension of the matrices $U_{VR}$ and $U_{SR}$, it may easily be noticed that d≥r is a basic requirement for the reconstruction.

From the graph signal processing technique discussed above, the estimation of the second set of azimuth values may now be considered in detail. Recalling that the second set of azimuth values are estimated using the computed phase angle and the one or more sparse three-dimensional shapes, in an embodiment, the one or more hardware processors 104, at step 203(i), identify, from the one or more sparse three-dimensional shapes, the first set of azimuth values corresponding to the first region of the object.

In an embodiment, the first region comprises a feature rich region of the object. As is known in the art, traditional techniques such as the MVS technique, and the like are based on feature correspondence, hence from the one or more sparse three-dimensional shapes, the first set of azimuth values may be directly identified. From the one or more sparse three-dimensional shapes (referred to in FIG. 4), the first set of azimuth values (in radians) may be identified as 0.7706, and 1.7507.

According to an embodiment of the present disclosure, at step 203(ii), the one or more hardware processors 104 construct, using the computed phase angle, a graph comprising a relational structure between the first set of azimuth values and the second set of azimuth values to be estimated. The proposed disclosure facilitates construction of the graph after taking two observations into consideration, namely, with only the polarized diffuse reflection or the polarized specular reflection, the absolute change of the phase angular field and azimuth field is synonymous, that is, the absolute angular distance amongst the respective phase angle values and azimuth values in a small neighborhood region is similar; and the change in the reflection type on the object causes abrupt change in the phase angular field by $$\frac{\pi}{2}.$$

Based upon the computed phase angle and the two observations discussed above, the proposed disclosure facilitates construction of the graph, wherein the constructed graph effectively captures the relational structure between each of the second set of azimuth values. The process of constructing the graph may now be considered in detail. Let $N_x \times N_y$ be the captured polarization image size and $N=N_xN_y$ denote the number of pixels in an image. In an embodiment, an N node graph indexed by the set $V=\{1, 2, \ldots, N\}$ may initially be constructed. Now, for any p, $(1 \le p \le N)$, $\emptyset_p$ denotes the phase angle at node p, and further between any two nodes $(p,q) \in V$, $p \ne q$, the edge weight $w_{pq}$ may be computed as in equation (7) below:

$$w_{pq} = \begin{cases} g(\emptyset_p, \emptyset_q), & \text{if } g(\emptyset_p, \emptyset_q) < \varepsilon_g \text{ and } dist\,(p,q) < \varepsilon_d \\ 0, & \text{otherwise} \end{cases} \quad \text{equation (7)}$$

wherein the function $$g(\emptyset_p, \emptyset_q) = \min(|\emptyset_i - \emptyset_j + \frac{\pi}{2}|, |\emptyset_i - \emptyset_j - \frac{\pi}{2}|, |\emptyset_i - \emptyset_j|)$$

and dist (p,q) denotes the Euclidean distance between the position of the pixels p and q. $g(\emptyset_p, \emptyset_q)$ computes the distance between the two angles $\emptyset_p$ and $\emptyset_q$, and it may be easily noticed that it is invariant to any change in the phase angle $\pi/2$ due to any change in reflection type.

Referring to equation (7) again, the factors $\varepsilon_g$ and $\varepsilon_d$ in equation (7) decide the neighborhood region. Considering an example scenario, referring to FIG. 5, an example of the constructed graph may be referred, wherein nodes represent the first region of the object.

According to an embodiment of the present disclosure, at step 203(iii), the one or more hardware processors 104 obtain a GFT matrix corresponding to the constructed graph. In an embodiment, referring to equation (7) yet again, using the edge weights $\varepsilon_g$ and $\varepsilon_d$, the remaining attributes of the graph such the graph Laplacian L, the GFT matrix U, and the like may be obtained. The graph Laplacian L, the GFT matrix U, and other remaining attributed may be obtained (or estimated) by implementing a graph signal reconstruction technique. In an example implementation, by implementing the graph signal processing technique discussed above, referring to the constructed graph in FIG. 5 again, the corresponding GFT matrix may be obtained as shown in Table 1 below:

TABLE 1

| | | | | |
|---|---|---|---|---|
| -0.3627 | -0.4324 | -0.5090 | -0.5239 | -0.3846 |
| -0.2583 | 0.4423 | -0.5065 | 0.5825 | -0.3767 |
| -0.6328 | -0.1296 | 0.6581 | 0.1632 | -0.3509 |
| 0.0815 | -0.7687 | -0.1390 | 0.5993 | 0.1550 |
| 0.6283 | -0.0986 | 0.1788 | 0.0236 | -0.7504 |

In an embodiment, the one or more hardware processors (104) perform a linear transformation on the GFT matrix by implementing a graph signal reconstruction technique to estimate the second set of azimuth values. As described in commonly owned and co-pending Indian application no. "201821009840", titled "Systems and methods for sampling and reconstruction of band-limited graph signals by a graph parity check matrix technique", the graph signal reconstruction technique provides for a reconstruction of sampled signals by a graph parity check matrix. The linear transformation matrix may be obtained by implementing the graph signal reconstruction technique graph signal reconstruction technique as shown in Table 2 below:

TABLE 2

| | |
|---|---|
| -0.9345 | 1.7033 |
| -7.6882 | 8.5235 |
| 0.0760 | 2.2173 |
| -3.6388 | 0.6157 |
| 0.0666 | 3.2210 |

According to an embodiment of the present disclosure, at step 203(iv), the one or more hardware processors 104 estimate, from the GFT matrix and the first set of azimuth values, the second set of azimuth values comprising unambiguous azimuth values corresponding to a second region of the surface the object by implementing the graph signal processing technique. In an embodiment, the second region comprises the feature-limited region of the object for which the second set of azimuth values are to be estimated. Referring to the constructed graph in FIG. 5 yet again, nodes 3, 4, and 5 represent the second region.

As mentioned above, the traditional systems and methods provide for resolving only $\pi/2$ ambiguity, and none of the traditional systems and methods provide for resolving $\pi$ ambiguity. The process of estimating the second set of azimuth values may now be considered in detail.

In an embodiment, let $\emptyset$, $\varphi \varepsilon \mathbb{R}^N$ denote a vector of phase angles and azimuth respectively which may be expressed as $\emptyset=[\emptyset_1, \emptyset_2, \ldots, \emptyset_N]^T$ and $\varphi=[\varphi_1, \varphi_2, \ldots, \varphi_N]^T$, wherein for any p, $(1 \le p \le N)$ similar to $\emptyset_p$, $\varphi_p$ denotes the azimuth at node p. Upon obtaining $\emptyset$, the constructed graph, and the first set of azimuth values, the problem (to be resolved by the proposed disclosure) is to estimate the second first of azimuth values.

According to an embodiment of the present disclosure, a GFT of $\emptyset$ and $\varphi$ may be computed as $\check{\emptyset}=U\emptyset$ and $\check{\varphi}=U\varphi$. Recalling that $\emptyset$ is nothing but the ambiguous estimate of $\emptyset$, it may be noticed that with the graph edge constructed using equation (7), both $\check{\emptyset}$ and $\check{\varphi}$ possess an identical smoothness, that is both have an identical cutoff graph frequency $\omega$, or in words $\check{\emptyset}$, $\check{\varphi} \in PW_\omega(G)$. Let $V^+$ denote the set of vertices corresponding to the first set of region (that is, the feature-rich region) of the object for which a reliable depth information, and thereby, the first set of azimuth values are available.

The graph signals $\emptyset_{V^+}+C_\emptyset$, $\varphi_{V^+}+C_\varphi$ denote the phase angle and the azimuth respectively corresponding to graph indices (or the set of vertices) $V^+$. Since the phase angle corresponding to the set of vertices $V^+$ is unambiguous, $\emptyset_{V^+}=\varphi_{V^+}$. Noting that the set $V^+$ and the graph signal $\varphi_{V^+}$ is analogous to the sampling set S and the sampled graph signal $f_S$ (as discussed in the graph signal processing technique above), from this analogy, the sampled azimuth $\varphi_{V^+}$, and using equation (2), the azimuth signal (or the second set of azimuth values) may be estimated as shown in equation (8) below:

$$\varphi = (U_{VR}(U_{V^+R}{}^H U_{V^+R})^{-1} U_{V^+R}{}^H) \varphi_{V^+}$$ equation (8), wherein $U_{V^+R}$ is similar to $U_{SR}$, and the set R may be found by observing the GFT spectrum Ø̃, since Ø̃, φ̃ ∈ $PW_\omega(G)$ as discussed above. Further, a cutoff graph frequency ω may be determined by putting a threshold on the GFT spectrum of Ø̃, since the GFT spectrum does not exactly reaches 0. The estimated φ resolves both π and π/2 ambiguity. Further, as discussed in the graph signal processing technique above, |V⁺|>|R| comprises a basic requirement for estimating φ. Thus, the step of constructing the graph comprises representing, by the graph signal processing technique, a Graph Fourier Transform (GFT) spectrum of the phase angle for estimating the second set of azimuth values.

In an example implementation, from the GFT matrix in Table 1 above and the identified first set of values, the second set of azimuth values (in radians) may be estimated as 1.9068, −2.0293, and 2.7394. Further, referring to FIG. 5 yet again, an example of the GFT spectrum (comprising node 1 and node 2) may be referred.

According to an embodiment of the present disclosure, at step 204, the one or more hardware processors 104 classify, based upon a comparison of the estimated second set of azimuth values and the computed phase angle, a polarized specular reflection dominant region and a polarized diffuse reflection dominant region of the object. In an embodiment, the comparison may be performed based upon a combination of the identified first set of azimuth values and the estimated second set of azimuth values. Thus, the combination of the identified first set of azimuth values and the estimated second set of azimuth values (in radians) may comprise:

0.7706, 1.7507, 1.9068, −2.2093, and 2.7394;

In an embodiment, the comparison may be performed, for example, by subtracting the computed phase angle from the first set of azimuth values and the second set of azimuth values. In an example implementation, considering the phase angle computed in step 202(ii) above, that is, Ø=0.9777, 0.0896, 0.5204, 0.3205, and 0.8261, the below set of values may be obtained based upon the comparison for classifying the polarized specular reflection dominant region and the polarized diffuse reflection dominant region of the object:

−0.2071, 1.6611, 1.3864, −3.9205, and 1.9132;

wherein the first value, that is, −0.2071 may be obtained by subtracting 0.09777 from 0.7706, the second value, 1.6611 may be obtained by subtracting 0.0896 from 1.7507, and the like.

Referring to the set of values above, it may be noted that the second value, the third value and the fifth value are closer to π/2 (that is, 1.57), thereby meaning that a second node, a third node, and a fifth node (when considered on a graph comprising a set of five edges) are closer to π/2, and hence the second node, the third node, and the fifth node may be classified as the polarized specular reflection dominant region while the first node and the fourth node may be classified as the polarized diffuse reflection dominant region. Finally, the fourth node shows π ambiguity getting resolved.

According to an embodiment of the present disclosure, at step 205, the one or more hardware processors 104 estimate a zenith angle based upon the classification of the polarized specular reflection dominant region and the polarized diffuse reflection dominant region of the object, by implementing a non-linear least squares estimation technique, wherein the zenith angle is a function of the degree of polarization and a refractive index of the surface of the object. The zenith angle θ may be estimated using equation (3) or equation (4).

As is known in the art, the Non-linear least squares technique is a form of least squares analysis used to fit a set of m observations with a model that is non-linear in n unknown parameters (m>n). It is used in some forms of nonlinear regression. The basis of the technique is to approximate the model by a linear one and to refine the parameters by successive iterations.

Generally, as is known in the art, a zenith angle (along with an angle of azimuth and a degree of polarization) facilitates obtaining of one or more gradients of pixels, wherein the one or more gradients of pixels are variations in a depth of the set of multi-view polarized images on primary and secondary axis, and wherein the primary and secondary axis denote horizontal and vertical axis corresponding to a multi-view polarized image (from amongst the set of multi-view polarized images) captured using the image capturing device. In an embodiment, the zenith angle estimated facilitates a reconstruction of a three-dimensional surface (that is, a dense 3D surface) of the object (shown and discussed in step 206 below). In an example implementation, the zenith angle may be estimated as θ=35 degrees (that is, 0.610 in radians).

According to an embodiment of the present disclosure, at step 206, using the second set of azimuth values and the zenith angle, the dense three-dimensional surface of the object may be reconstructed. By integrating the estimated second set of azimuth values and the estimated zenith angle, that is, using (Ø, φ), the reconstruction of the dense three-dimensional surface may be performed using any of the known traditional systems and methods, for example, by an Isocontour depth tracing technique.

According to an embodiment of the present disclosure, an example implementation of the proposed methodology (that is, estimation of the second set of azimuth values by the graph signal processing technique), and its comparison with the traditional systems and methods may be considered in detail via a set of simulation results. The proposed methodology was executed on an object, that is, a synthetic object. Initially, both the zenith angle and the angle of azimuth are estimated (or computed) using traditional systems and techniques, and five polarized images corresponding to five different polarization angles, that is, {0,30,60,90,120} may be obtained. Further, the phase angle Ø was computed at every point (that is, for each of the set of five neighboring points) by solving equation (1).

Using the computed phase angle Ø, the graph may be constructed by the graph signal processing technique discussed above, by assuming $\varepsilon_g = \pi/6$ and $\varepsilon_d = 10$. Further, the GFT matrix corresponding to the constructed graph may be obtained by implementing the graph signal processing technique. Referring to FIG. 6A, magnitude plots of a Graph Fourier spectrum of an actual azimuth (that is, ground truth azimuth) with respect to graph frequencies λ may be referred. Further referring to FIG. 6B, magnitude plots of a Graph Fourier spectrum of the computed phase angle with respect to the graph frequencies λ may be referred.

Referring to FIG. 6 again, it may be noted that the phase angle and a combination of the identified first set of azimuth values and the second set of azimuth values estimated have an identical bandlimitedness captured on the constructed graph, and wherein the identical bandlimitedness represents an optimal representation (that is, a well captured relational structure) between each of the combined first set of azimuth values and the second set of azimuth values.

Hence, by using Ø and from the GFT spectrum, the one or more hardware processors 104 select the cut-off graph frequency to estimate the second set of azimuth values, and wherein the cut-off graph frequency corresponds to the constructed graph. Referring to FIG. 6 yet again, it may be noted that after a graph frequency of 50, the magnitude becomes negligible, and hence the cut-off graph frequency may be selected as ω=50, and the corresponding |R|=70.

Further, the sampling set |V⁺| (as discussed in the graph signal processing technique above) may be selected as 100 (around 13%), and the graph indices of the sampling set |V⁺| may be selected randomly. At these locations, it may be assumed that the actual azimuth is known (as discussed above), and by using equation (8), the second set of azimuth values for feature-limited regions of the synthetic object may be estimated.

According to an embodiment of the present disclosure, the comparison of the proposed methodology with the traditional systems and methods may now be considered in detail, wherein the comparison facilitates a classification of the polarized specular dominant region and the polarized diffuse dominant region. For simulation and the classification purposes, both the polarized specular dominant region and the polarized diffuse dominant region were initially generated by the one or more hardware processors 104 in a checker pattern, as shown in FIG. 7A. Referring to FIG. 7A again, regions corresponding to white show the polarized specular dominant, while regions corresponding to black show the polarized diffuse dominant.

The one or more hardware processors 104 further select 70 samples (that is, around 9% of samples) for a plurality of unambiguous locations. Referring to FIG. 7B through 7C, a classification of the results obtained by implementing the proposed methodology, and by implementing the traditional systems and methods (for example, the PMS technique) may be referred. Referring to FIG. 7B through 7C again, it may be noted that, with an equal number of samples, the proposed methodology performs a better classification, as compared to the traditional systems and methods.

According to an embodiment of the proposed disclosure, advantages of the proposed graph signal processing technique for the dense three-dimensional surface reconstruction may now be considered. As discussed via steps 201 through 206, the proposed methodology provides for resolving π and π/2 ambiguities separately. Also, referring to FIG. 7A though 7C yet again, the proposed methodology shows a significant improvement in resolving π/2 ambiguity as compared to some of the traditional systems and methods, for example, label propagation approach.

Upon estimation of azimuth values corresponding to feature-limited regions (that is, by estimating the second set of values for the second region of the object), any of the traditional systems and methods may be implemented for a dense depth reconstruction of sparse objects. Finally, as shown via simulation results above, the proposed methodology requires a very small number of samples (as compared with the traditional systems and methods) from feature-rich regions of an object for estimating azimuth values at feature-limited regions.

In an embodiment, the memory 102 can be configured to store any data that is associated with the dense surface reconstruction of the object using the graph signal processing technique. In an embodiment, the information pertaining to the plurality of multi-view polarized images, the one or more sparse three-dimensional shapes, the degree of polarization and the phase angle, the first set of azimuth values, the constructed graph, and the second set of azimuth values etc. is stored in the memory 102. Further, all information (inputs, outputs and so on) pertaining to the dense surface reconstruction of the object using the graph signal processing technique, may also be stored in the database, as history data, for reference purpose.

The written description describes the subject matter herein to enable any person skilled in the art to make and use the embodiments. The scope of the subject matter embodiments is defined by the claims and may include other modifications that occur to those skilled in the art. Such other modifications are intended to be within the scope of the claims if they have similar elements that do not differ from the literal language of the claims or if they include equivalent elements with insubstantial differences from the literal language of the claims.

The embodiments of present disclosure herein address unresolved problem of resolving π ambiguity by implementing the graph signal processing technique. The embodiments thus provide for the dense surface reconstruction by resolving w ambiguity. Moreover, the embodiments disclosed herein further provide for the classification of the polarized specular reflection dominant region and the polarized diffuse reflection dominant region based upon the comparison of the estimated second set of azimuth values and the phase angle.

It is to be understood that the scope of the protection is extended to such a program and in addition to a computer-readable means having a message therein; such computer-readable storage means contain program-code means for implementation of one or more steps of the method, when the program runs on a server or mobile device or any suitable programmable device. The hardware device can be any kind of device which can be programmed including e.g. any kind of computer like a server or a personal computer, or the like, or any combination thereof. The device may also include means which could be e.g. hardware means like e.g. an application-specific integrated circuit (ASIC), a field-programmable gate array (FPGA), or a combination of hardware and software means, e.g. an ASIC and an FPGA, or at least one microprocessor and at least one memory with software modules located therein. Thus, the means can include both hardware means and software means. The method embodiments described herein could be implemented in hardware and software. The device may also include software means. Alternatively, the embodiments may be implemented on different hardware devices, e.g. using a plurality of CPUs.

The embodiments herein can comprise hardware and software elements. The embodiments that are implemented in software include but are not limited to, firmware, resident software, microcode, etc. The functions performed by various modules described herein may be implemented in other modules or combinations of other modules. For the purposes of this description, a computer-usable or computer readable medium can be any apparatus that can comprise, store, communicate, propagate, or transport the program for use by or in connection with the instruction execution system, apparatus, or device.

The illustrated steps are set out to explain the exemplary embodiments shown, and it should be anticipated that ongoing technological development will change the manner in which particular functions are performed. These examples are presented herein for purposes of illustration, and not limitation. Further, the boundaries of the functional building blocks have been arbitrarily defined herein for the convenience of the description. Alternative boundaries can be defined so long as the specified functions and relationships thereof are appropriately performed. Alternatives (including equivalents, extensions, variations, deviations, etc., of those described herein) will be apparent to persons skilled in the relevant art(s) based on the teachings contained herein. Such alternatives fall within the scope of the disclosed embodiments. Also, the words "comprising," "having," "containing," and "including," and other similar forms are intended to be equivalent in meaning and be open ended in that an item or items following any one of these words is not meant to be an exhaustive listing of such item or items, or meant to be limited to only the listed item or items. It must also be noted that as used herein and in the appended claims, the singular forms "a," "an," and "the" include plural references unless the context clearly dictates otherwise.

Furthermore, one or more computer-readable storage media may be utilized in implementing embodiments consistent with the present disclosure. A computer-readable storage medium refers to any type of physical memory on which information or data readable by a processor may be stored. Thus, a computer-readable storage medium may store instructions for execution by one or more processors, including instructions for causing the processor(s) to perform steps or stages consistent with the embodiments described herein. The term "computer-readable medium" should be understood to include tangible items and exclude carrier waves and transient signals, i.e., be non-transitory. Examples include random access memory (RAM), read-only memory (ROM), volatile memory, nonvolatile memory, hard drives, CD ROMs, DVDs, flash drives, disks, and any other known physical storage media.

It is intended that the disclosure and examples be considered as exemplary only, with a true scope of disclosed embodiments being indicated by the following claims.

What is claimed is:

1. A method for a dense surface reconstruction of an object using graph signal processing, the method being implemented by a processor and comprising:
   capturing, using an image capturing device, a plurality of multi-view polarized images, wherein each of the plurality of multi-view polarized images comprises a multi-pixel image of the object varying with a plurality of angles of polarization;
   performing, by one or more hardware processors, a plurality of operations based upon the plurality of polarized images captured, wherein the plurality of operations comprise:
      (i) extracting, by implementing a Multi-View Stereo (MVS) technique on each of the plurality of multi-view polarized images captured, one or more sparse three-dimensional shapes of the object, wherein the one or more sparse three-dimensional shapes are used to identify a first set of azimuth values corresponding to a first region of the object; and
      (ii) computing, by implementing a polarization reflectance modelling technique on the plurality of multi-view polarized images captured, a degree of polarization and a phase angle corresponding to each view of a surface point of the object;
   estimating, using the phase angle and the one or more sparse three-dimensional shapes, a second set of azimuth values by a graph signal processing technique, wherein the estimation comprises:
      (i) identifying, from the one or more sparse three-dimensional shapes, the first set of azimuth values corresponding to the first region of the object;
      (ii) constructing, using the phase angle, a graph capturing a relational structure between the first set of azimuth values and the second set of azimuth values to be estimated;
      (iii) obtaining, a Graph Fourier Transform (GFT) matrix corresponding to the constructed graph by the graph signal processing technique; and
      (iv) estimating, from the GFT matrix and the first set of azimuth values, the second set of azimuth values comprising unambiguous azimuth values corresponding to a second region of the object by the graph signal processing technique;
   classifying, based upon a comparison of the estimated second set of azimuth values and the phase angle, a polarized specular reflection dominant region and a polarized diffuse reflection dominant region of the object;
   estimating, based upon the classification, a zenith angle by implementing a non-linear least squares estimation technique, wherein the zenith angle is a function of the degree of polarization and refractive index of surface of the object; and
   reconstructing, using the second set of azimuth values and the zenith angle, a dense three-dimensional surface of the object.

2. The method as claimed in claim 1, wherein estimating the second set of azimuth values is preceded by obtaining a sampling set corresponding to the first set of azimuth values by implementing the graph signal processing technique.

3. The method as claimed in claim 1, wherein estimating the second set of azimuth values comprises performing a linear transformation on the GFT matrix using a graph signal reconstruction technique.

4. The method as claimed in claim 1, wherein constructing the graph comprises representing, by the graph signal processing technique, a Graph Fourier Transform (GFT) spectrum of the phase angle for estimating the second set of azimuth values.

5. The method as claimed in 4, wherein representing the GFT spectrum comprises selecting, based upon the GFT spectrum, a cut-off graph frequency to estimate the second set of azimuth values, and wherein the cut-off graph frequency corresponds to the constructed graph.

6. The method as claimed in claim 1, wherein the phase angle and a combination of the identified first set of azimuth values and the estimated second set of azimuth values have an identical band limitedness captured on the constructed graph, and wherein the identical band limitedness represents an optimal representation between each of the combined first set of azimuth values and the second set of azimuth values.

7. A system for a dense surface reconstruction of an object using graph signal processing, the system comprising:
   a memory storing instructions;
   one or more communication interfaces; and
   one or more hardware processors coupled to the memory via the one or more communication interfaces, wherein the one or more hardware processors are configured by the instructions to:
      capture, using an image capturing device, a plurality of multi-view polarized images, wherein each of the plurality of multi-view polarized images comprises a multi-pixel image of the object varying with a plurality of angles of polarization;
      perform a plurality of operations based upon the plurality of polarized images captured, wherein the plurality of operations comprise:

(i) extracting, by implementing a Multi-View Stereo (MVS) technique on each of the plurality of multi-view polarized images captured, one or more sparse three-dimensional shapes of the object, wherein the one or more sparse three-dimensional shapes are used to identify a first set of azimuth values corresponding to a first region of the object; and (ii) computing, by implementing a polarization reflectance modelling technique on the plurality of multi-view polarized images captured, a degree of polarization and a phase angle corresponding to each view of a surface point of the object;

estimate, using the phase angle and the one or more sparse three-dimensional shapes, a second set of azimuth values by a graph signal processing technique, wherein the estimation comprises:

(i) identifying, from the one or more sparse three-dimensional shapes, the first set of azimuth values corresponding to the first region of the object;

(ii) constructing, using the phase angle, a graph capturing a relational structure between the first set of azimuth values and the second set of azimuth values to be estimated;

(iii) obtaining, a Graph Fourier Transform (GFT) matrix corresponding to the constructed graph by the graph signal processing technique; and (iv) estimating, from the GFT matrix and the first set of azimuth values, the second set of azimuth values comprising unambiguous azimuth values corresponding to a second region of the object by the graph signal processing technique;

classify, based upon a comparison of estimated the second set of azimuth values and the phase angle, a polarized specular reflection dominant region and a polarized diffuse reflection dominant region of the object;

estimate, based upon the classification, a zenith angle by implementing a non-linear least squares estimation technique, wherein the zenith angle is a function of the degree of polarization and refractive index of surface of the object; and reconstruct, using the second set of azimuth values and the zenith angle, a dense three-dimensional surface of the object.

8. The system as claimed in claim 7, wherein the one or more hardware processors are further configured to estimate the second set of azimuth values by obtaining a sampling set corresponding to the first set of azimuth values by implementing the graph signal processing technique.

9. The system as claimed in claim 7, wherein the one or more hardware processors are further configured to perform a linear transformation on the GFT matrix using a graph signal reconstruction technique to estimate the second set of azimuth values.

10. The system as claimed in claim 7, wherein the one or more hardware processors are further configured to construct the graph by representing, using the graph signal processing technique, a Graph Fourier Transform (GFT) spectrum of the phase angle for estimating the second set of azimuth values.

11. The system as claimed in claim 10, wherein the one or more hardware processors are further configured to represent the GFT spectrum by selecting, based upon the GFT spectrum, a cut-off graph frequency to estimate the second set of azimuth values, and wherein the cut-off graph frequency corresponds to the constructed graph.

12. The system as claimed in claim 7, wherein the phase angle and a combination of the identified first set of azimuth values and the estimated second set of azimuth values have an identical band limitedness captured on the constructed graph, and wherein the identical band limitedness represents an optimal representation between each of the combined first set of azimuth values and the second set of azimuth values.

13. One or more non-transitory machine readable information storage media storing instructions that, when executed by one or more hardware processors, cause the one or more hardware processors to perform a method comprising:

capturing, using an image capturing device, a plurality of multi-view polarized images, wherein each of the plurality of multi-view polarized images comprises a multi-pixel image of the object varying with a plurality of angles of polarization;

performing, by one or more hardware processors, a plurality of operations based upon the plurality of polarized images captured, wherein the plurality of operations comprise:

(i) extracting, by implementing a Multi-View Stereo (MVS) technique on each of the plurality of multi-view polarized images captured, one or more sparse three-dimensional shapes of the object, wherein the one or more sparse three-dimensional shapes are used to identify a first set of azimuth values corresponding to a first region of the object; and (ii) computing, by implementing a polarization reflectance modelling technique on the plurality of multi-view polarized images captured, a degree of polarization and a phase angle corresponding to each view of a surface point of the object;

estimating, using the phase angle and the one or more sparse three-dimensional shapes, a second set of azimuth values by a graph signal processing technique, wherein the estimation comprises:

(i) identifying, from the one or more sparse three-dimensional shapes, the first set of azimuth values corresponding to the first region of the object;

(ii) constructing, using the phase angle, a graph capturing a relational structure between the first set of azimuth values and the second set of azimuth values to be estimated;

(iii) obtaining, a Graph Fourier Transform (GFT) matrix corresponding to the constructed graph by the graph signal processing technique; and (iv) estimating, from the GFT matrix and the first set of azimuth values, the second set of azimuth values comprising unambiguous azimuth values corresponding to a second region of the object by the graph signal processing technique;

classifying, based upon a comparison of the estimated second set of azimuth values and the phase angle, a polarized specular reflection dominant region and a polarized diffuse reflection dominant region of the object;

estimating, based upon the classification, a zenith angle by implementing a non-linear least squares estimation technique, wherein the zenith angle is a function of the degree of polarization and refractive index of surface of the object; and reconstructing, using the second set of azimuth values and the zenith angle, a dense three-dimensional surface of the object.

14. The one or more non-transitory machine readable information storage media of claim 13, wherein estimating the second set of azimuth values is preceded by obtaining a sampling set corresponding to the first set of azimuth values by implementing the graph signal processing technique.

15. The one or more non-transitory machine readable information storage media of claim 13, wherein estimating the second set of azimuth values comprises performing a linear transformation on the GFT matrix using a graph signal reconstruction technique.

16. The one or more non-transitory machine readable information storage media of claim 13, wherein constructing the graph comprises representing, by the graph signal processing technique, a Graph Fourier Transform (GFT) spectrum of the phase angle for estimating the second set of azimuth values.

17. The one or more non-transitory machine readable information storage media of claim 16, wherein representing the GFT spectrum comprises selecting, based upon the GFT spectrum, a cut-off graph frequency to estimate the second set of azimuth values, and wherein the cut-off graph frequency corresponds to the constructed graph.

18. The one or more non-transitory machine readable information storage media of claim 13, wherein the phase angle and a combination of the identified first set of azimuth values and the estimated second set of azimuth values have an identical band limitedness captured on the constructed graph, and wherein the identical band limitedness represents an optimal representation between each of the combined first set of azimuth values and the second set of azimuth values.

* * * * *